United States Patent [19]

Overhauser et al.

[11] Patent Number: 4,860,074
[45] Date of Patent: Aug. 22, 1989

[54] ALTERNATING GRADIENT PHOTODETECTOR

[75] Inventors: Albert W. Overhauser, West Lafayette, Ind.; Joseph Maserjian, Goleta, Calif.

[73] Assignee: The United States of America as represented by the Administrator, National Aeronautics and Space Administration, Washington, D.C.

[21] Appl. No.: 116,811

[22] Filed: Nov. 5, 1987

[51] Int. Cl.⁴ .......................................... H01L 27/14
[52] U.S. Cl. ..................................... 357/30; 357/58; 357/90; 357/4; 357/29
[58] Field of Search .................. 357/30 B, 30 F, 30 P, 357/30 R, 58, 90, 4, 29, 30 D

[56] References Cited

U.S. PATENT DOCUMENTS

| | | | |
|---|---|---|---|
| 4,383,269 | 5/1983 | Capasso | 357/30 |
| 4,415,370 | 11/1983 | Kagawa et al. | 357/90 X |
| 4,433,343 | 2/1984 | Levine | 357/86 X |
| 4,450,463 | 5/1984 | Chin | 357/30 |
| 4,476,477 | 9/1984 | Capasso et al. | 357/30 |
| 4,514,748 | 4/1985 | Bean et al. | 357/90 X |
| 4,561,005 | 12/1985 | Shannon | 357/24 |
| 4,568,960 | 2/1986 | Petroff et al. | 357/58 X |
| 4,599,632 | 8/1986 | Bethea et al. | 357/30 |
| 4,616,241 | 7/1986 | Biefeld et al. | 357/16 |
| 4,620,214 | 10/1986 | Margalit et al. | 357/63 |

OTHER PUBLICATIONS

Hadek et al., "Extension of Long Wavelength Response by Modulation Doping in Extrinsic Germanium Infrared Detectors," Appl. Phys. Lett. 46 (4) Feb. 15, 1985, pp. 403-405.
Stapelbroek et al, "Origin of Excess Low-Frequency Noise at Intermediate Infrared Backgrounds in BIB Detectors," IRIS, Aug. 15, 1984, Seattle, WA, pp. 1-11.
Petroff et al, "Responsivity and Noise Models of Blocked Impurity Band Detectors," IRIS Specialty Group on IR Detectors, Seattle, WA, Aug. 15, 1984, pp. 1-19.

Primary Examiner—William Mintel
Attorney, Agent, or Firm—Thomas H. Jones; John R. Manning; Charles E. B. Glenn

[57] ABSTRACT

A far infrared (FIR) range responsive photodetector. There is a substrate (28) of degenerate germanium. A a plurality of alternating impurity-band (32) and high resistivity (30) layers of germanium are disposed on the substrate (28). The impurity-band layers (32) have a doping concentration therein sufficiently high to include donor bands which can release electrons upon impingement by FIR photons of energy hv greater than an energy gap $\epsilon$. The high resistivity layers (30) have a doping concentration therein sufficiently low as to not include conducting donor bands and are depleted of electrons. Metal contacts (36, 38) are provided for applying an electrical field across the substrate (28) and the plurality of layers (30, 32). In the preferred embodiment as shown, the substrate (28) is degenerate n-type (n++) germanium; the impurity-band layers (32) are n+ layers of germanium doped to approximately the low $10^{16}$ cm$^{-3}$ range; and, the high resistivity layers (30) are n− layers of germanium doped to a maximum of approximately $10^{15}$ cm$^{-3}$. Additionally, the impurity-band layers (32) have a thickness less than a conduction-electron diffusion length in germanium and likely to be in the range of 0.1–1.0 micron, the plurality of impurity-bands (33) is of a number such that the flux of FIR photons (20) passing therethrough will be substantially totally absorbed therein, the thickness of the high resistivity layers (30) is such compared to the voltage applied that the voltage drop in each the high resistivity layers (30) controls the occurance of impact ionization in the impurity-band layers (32) to a desired level.

10 Claims, 3 Drawing Sheets

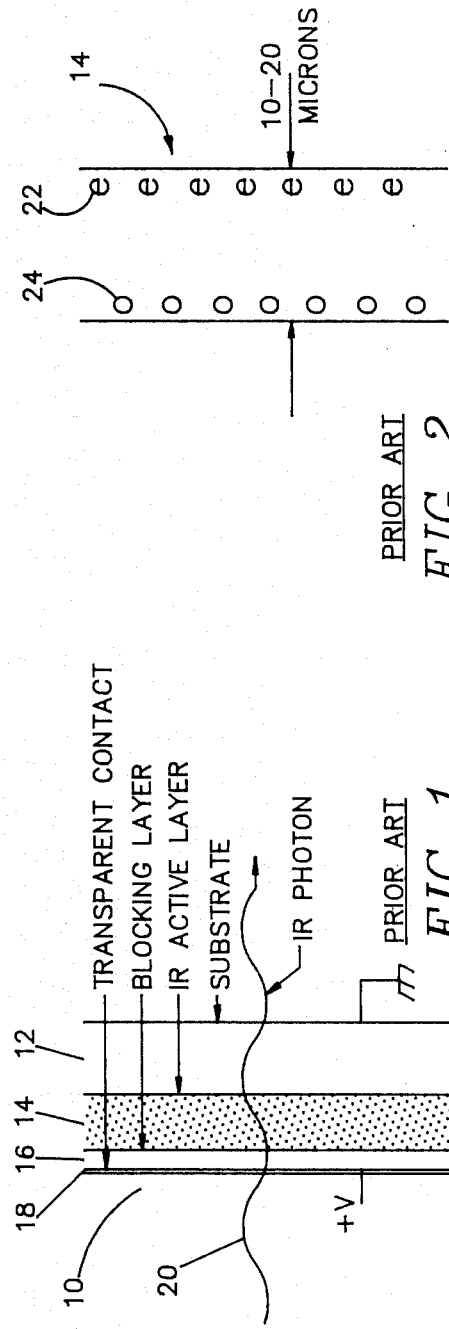
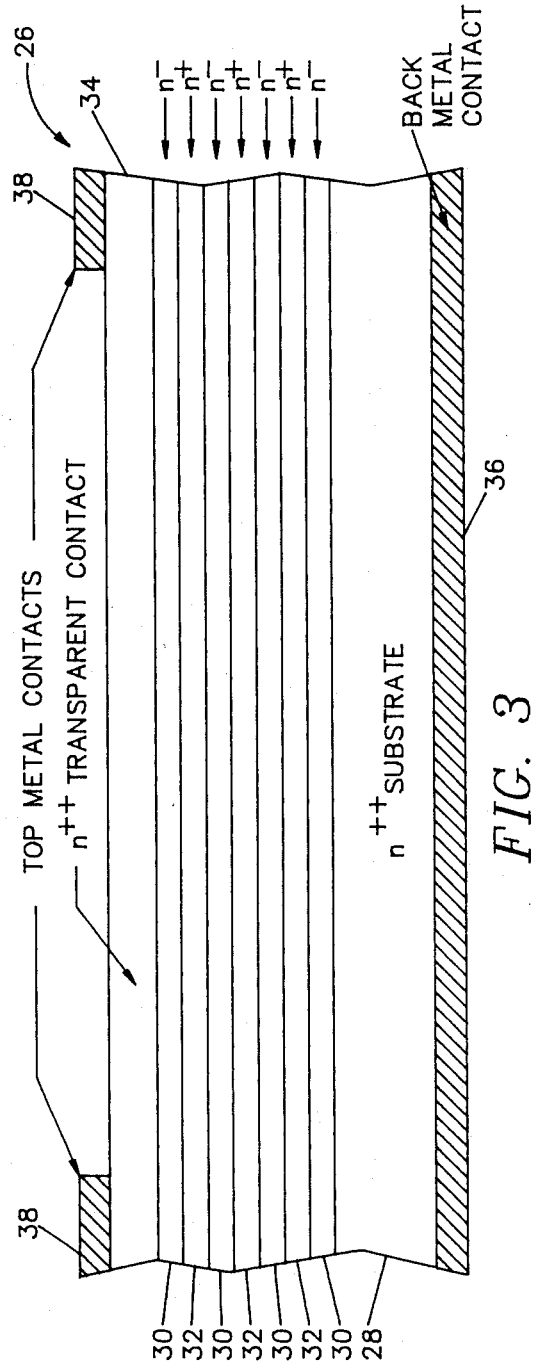

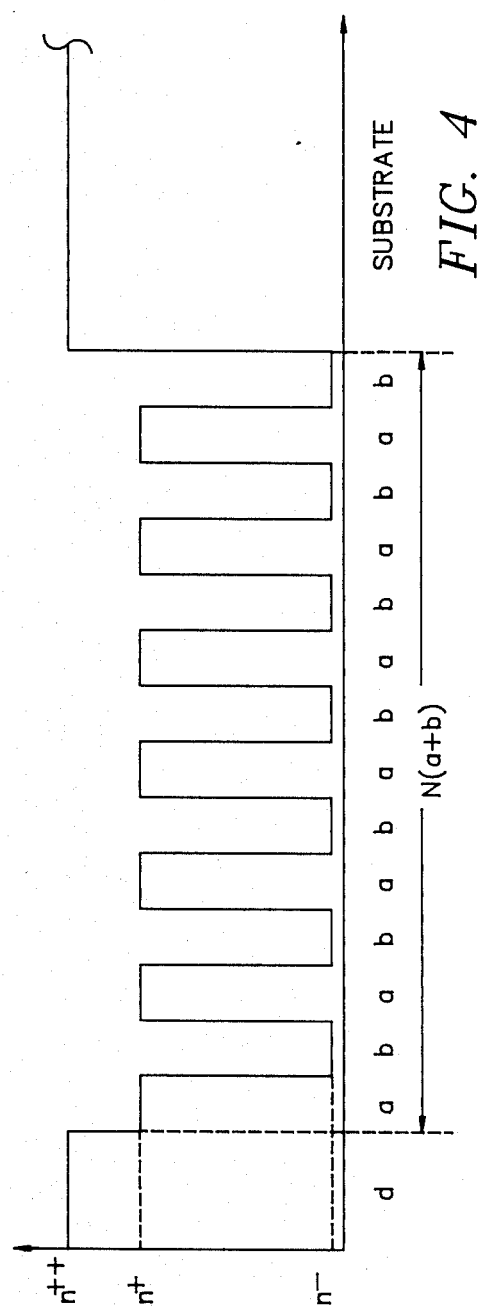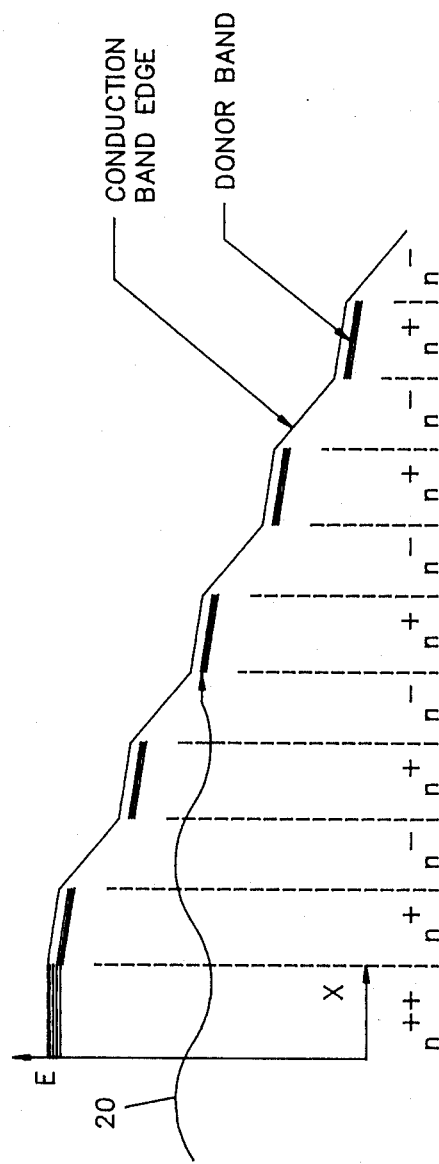

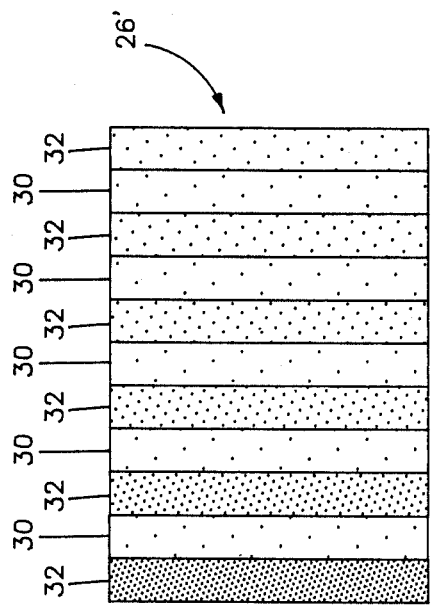
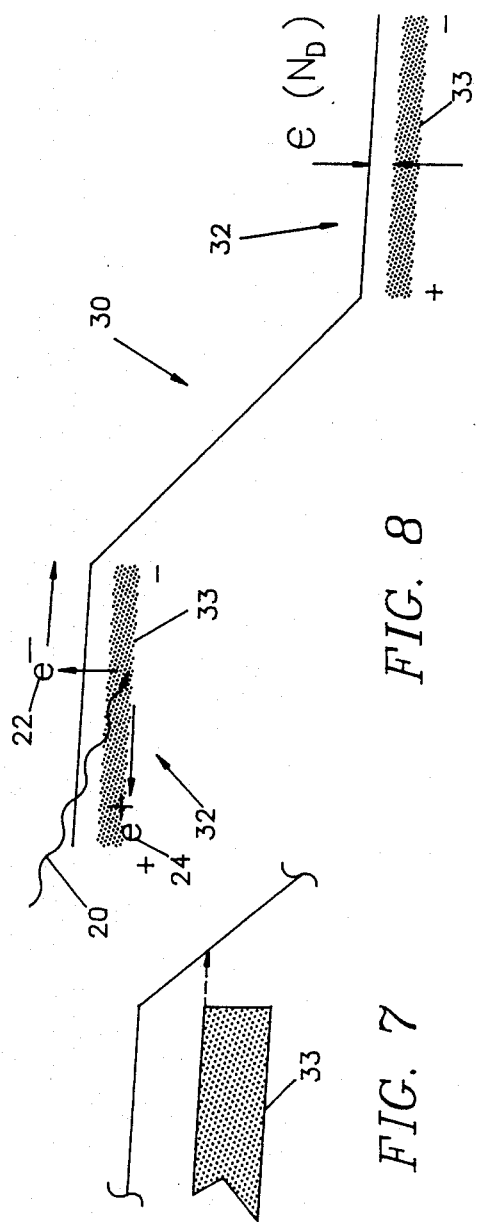
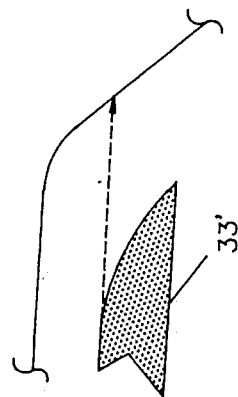
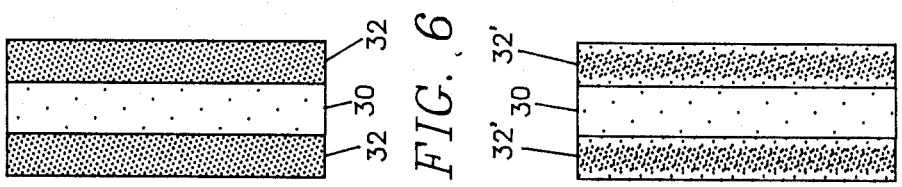

4,860,074

ALTERNATING GRADIENT PHOTODETECTOR

ORIGIN OF THE INVENTION

The invention described herein was made in the performance of work under a NASA contract and is subject to the provisions of Public Law 96-517 (35 USC 202) in which the Contractor has elected not to retain title. 1. Technical Field The present invention relates to photodetectors for use in infrared detection and, more particularly to an infrared photodetector useful in the far infrared region comprising, a substrate of a semiconductor material; a plurality of alternating impurity-band and high resistivity layers of semiconductor material disposed on the substrate, the impurity-band layers having a doping concentration therein sufficiently high to include donor bands which can release electrons upon impingement by infrared photons of energy $h\nu$ greater than an energy gap $\epsilon$, the high resistivity layers having a doping concentration therein sufficiently low as to not include conducting donor bands and being depleted of electrons; and, means for applying an electrical field across the substrate and the plurality of layers.

2. Description of the Prior Art

There is a need in space applications for a far-infrared (FIR) photodetector (30–200 $\mu$m) having high detectivity as well as the potential for being fabricated into focal-plane arrays. The well-known technology includes bolometers and extrinsic-semiconductor photoconductors. Such devices lack sensitivity and/or response speed, and are not readily adaptable to arrays.

An established approach to long wavelength infrared (LWIR) detection, and the most relevant art to the present invention, is the blocked impurity-band (BIB) detector as described in great detail in the papers "RESPONSIVITY AND NOISE MODELS OF BLOCKED IMPURITY BAND DETECTORS" by M. D. Petroff and M. G. Stapelbroek and "ORIGIN OF EXCESS LOW-FREQUENCY NOISE AT INTERMEDIATE INFRARED BACKGROUNDS IN BIB DETECTORS" by M. D. Petroff, M. G. Staplbroek, J. J. Speer and R. Bharat. The above-referenced papers were presented in August of 1984 at the IRIS Specialty Group on IR Detectors at Seattle, Wash. Copies of both papers are being filed with this application for the convenience of the Patent Office. A basic discussion of BIB technology follows hereinafter as well.

Blocked impurity band (BIB) detectors have been developed with extrinsic silicon material for LWIR in the wavelength range of 10–30 $\mu$m. Attempts to extend this BIB technology to the FIR using extrinsic germanium have thus far failed. In the case of germanium, the material becomes degenerate (i.e. metal-like), losing its extrinsic photoconducting properties at relatively low dopant concentrations (low $10^{16}$ cm$^{-3}$) compared with silicon ($>10^{18}$ cm$^{-3}$). This means that the active doped region must be much thicker than that of silicon ($>>30$ $\mu$m) to achieve good absorption or the quantum efficiency and detectivity will be very low. A necessary requirement of the BIB detector, however, is that the impurity band of the active (doped) region be depleted of carriers from unwanted compensating impurities. This requirement becomes increasingly difficult and impractical if the region becomes too thick because of severe constraints on the breakdown field due to field emissions of electrons (or alternatively, holes) from the impurity band into the conduction (valence) band. Improved purity control of the germanium material reduces these unwanted carriers; however, there are practical limits to what can be achieved and what can be controlled with uniformity over a large area such as required for arrays (e.g., $10^{11}$–$10^{12}$ cm$^{-3}$ compensating impurities). At these impurity limits, the thickness of the active region is limited to that used in silicon BIBs (e.g. $\lesssim 30$ $\mu$m). Unfortunately, such thicknesses are inadequate for germanium BIB detectors and thus one is limited to much lower quantum efficiencies and detectivities.

The problems associated with BIB technology and its application to germanium and the detection of FIR can best be understood with reference to the simplified drawings of FIGS. 1 and 2. The BIB detector, generally indicated as 10, comprises a substrate 12 upon which an IR active layer 14 and blocking layer 16 are "grown" by conventional chemical vapor deposition (CVD) technology. The IR active layer 14 is appropriately doped while the blocking layer 16 is undoped. The doping can be either n-doping or p-doping, as desired, and only affects the polarity of the field applied thereto. Electrical contact can be made to the substrate 12 and to the blocking layer 16 by means of a transparent contact 18. The IR active layer 14, by virtue of the process by which it was created and otherwise, contains impurities which cause a background current flow which must be "swept" out to allow the signals of interest to be detected. This is accomplished by the application of an electrical voltage across the detector 10 between the transparent contact 18 and the substrate 12 as indicated in FIG. 1. This must be a low voltage (a few volts at most) because of breakdown. The blocking layer 16 is necessary to make the detector 10 responsive to the incidence of IR photons 20 thereon. Without the blocking layer 16, electron flow could take place unhampered because of the conductivity of the doped IR active layer 14. With a sufficiently high doping level, however, electrons 22 will be excited into the conduction (valence) band with low energy photons corresponding to the FIR wavelength region.

As depicted in FIG. 2, the application of the voltage across the IR active layer 14 to create the sweeping field causes the electrons 22 to migrate towards the anode side of the layer 14 and the "holes" 24 to migrate towards the cathode side. Unfortunately, there is a limit to the sweeping field which can be applied without exceeding breakdown fields and causing the detector 10 itself to cease operation for its intended purpose of photodetection. The limiting of the field strength, in turn, limits the thickness of the IR active layer 14 which can be effectively depleted of carriers. In the silicon BIB detectors employed for LWIR detection, the IR active layer 14 has a practical thickness limit of 10–20 microns as mentioned in the above-referenced papers filed herewith. Ideally, all the energy of the incident IR photons 20 would be absorbed in the IR active layer 14 and cause electrons 22 to be excited into the conduction band. Just as depicted in the simplified drawing of FIG. 1, however, in the case of germanium the thin IR active layer 14 possible within the constraints described allows a great portion of the photon energy to pass through the detector unused; that is, the quantum efficiency of the detector 10 is quite poor. To achieve higher absorption, one would like to increase the doping; however, the energy gap ε goes to zero at high doping and the device ceases to work.

Those skilled in the art should begin to appreciate at this point the problems which are encountered when attempting to adopt the above-described BIB technology to the detection of FIR radiation. First, a material such as germanium must be employed; that is, silicon will not work at the energy levels involved. The energy ε must be kept lower than the photon energy of the FIR radiation where ε is a function of the doping level of the IR active layer 14. In attempting to adopt BIB technology to FIR detection, the designer falls into a difficult situation. Even if one can (through intensive quality control on impurity levels, and the like) create an IR active layer 14 of optimum dopant level and sufficiently low level of compensating impurities that the sweeping field is operative, the process would be virtually non-repeatable from detector to detector so that the use of the resultant detectors in a multi-detector array might be unachievable.

Thus, one can properly state that, at present, there is no method and apparatus for the detection of FIR radiation which is cost effective and sufficiently uniform so as to be incorporatable into arrays. The BIB technology which is the most relevant art is limited to low quantum efficiencies and requires the most stringent and limited conditions.

DISCLOSURE OF THE INVENTION

The above-described shortcomings of the prior art are overcome by the far infrared (FIR) photodetector of the present invention comprising, a substrate of degenerate germanium; a plurality of alternating impurity-band and high resistivity layers of germanium disposed on the substrate, the impurity-band layers having a suitable doping concentration therein sufficiently high to include donor bands which can release electrons upon impingement by FIR photons of energy $h\nu$ greater than an energy gap ε, the high resistivity layers having a doping concentration therein sufficiently low as to not include conducting donor bands and being depleted of electrons; and, means for applying an electrical field across the substrate and the plurality of layers.

In the preferred embodiment, the substrate is degenerate n-type $(n^{++})$ germanium; the impurity-band layers are $n^+$ layers of germanium doped to approximately the low $10^{16}$ cm$^{-3}$ range; and, the high resistivity layers are $n^-$ layers of germanium doped to less than approximately $10^{15}$ cm$^{-3}$.

Further in the preferred embodiment, the impurity-band layers have a thickness significantly less than a conduction-electron diffusion length in germanium, the plurality of impurity-bands is of a number such that the flux of FIR photons passing therethrough will be substantially totally absorbed therein, the thickness of the high resistivity layers is such compared to the voltage applied by the means for applying an electrical field across the substrate and the plurality of layers that the voltage drop in each the high resistivity layer controls the occurance of impact ionization in the impurity-band layers to a desired level, the doping level in respective ones of the plurality of impurity-band layers is varied with respect to the others of the impurity-band layers to achieve a desired spectral response across the entire photodetector, and the doping level in each of the plurality of impurity-band layers is varied within the layers to increase the breakdown level of the photodetector as well as further control the spectral response.

DETAILED DESCRIPTION OF THE DRAWINGS

FIG. 1 is a simplified cross-section through an IR detector of the BIB type according to the prior art.

FIG. 2 is a simplified cross-section of the IR active layer of the detector of FIG. 1 depicting the movement of the electrons and holes under the influence of a sweeping field employed to eliminate the background conduction effect of impurities in the layer.

FIG. 3 is an enlarged simplified drawing through a FIR detector according to the present invention.

FIG. 4 is a doping profile through a FIR detector according to the present invention.

FIG. 5 is a drawing depicting the alternating potential gradient profile of a FIR detector according to the present invention.

FIG. 6 is a simplified drawing through two adjacent heavily doped layers and a single intermediate lightly doped layer according to the preferred embodiment of the present invention wherein the layers are homogeneously doped.

FIG. 7 is an enlarged drawing in the manner of FIG. 5 showing the breakdown level when a homogeneous doping in the manner of FIG. 6 is employed.

FIG. 8 is an enlarged drawing of a portion of the potential profile of FIG. 5 showing the photo electron activation thereof.

FIG. 9 is a simplified drawing through two adjacent heavily doped layers and a single intermediate lightly doped layer according to the preferred embodiment of the present invention wherein the layers are non-homogeneously doped so as to taper off near the edges.

FIG. 10 is an enlarged drawing in the manner of FIG. 5 showing the expanded breakdown level when a non-homogeneous doping in the manner of FIG. 9 is employed.

FIG. 11 is a simplified drawing through a detector according to the present invention in an alternate embodiment wherein the various heavily doped layers are varied so as to provide the detector with a shaped spectral response.

DETAILED DESCRIPTION OF THE INVENTION

The alternating gradient photodetector (AGP) of the present invention is shown in simplified cross section in FIG. 3 wherein it is generally indicated as 26. As will be appreciated by those skilled in the art from the description which follows hereinafter, the structure is easily adapted to fabrication of large focal-plane arrays. In this regard, the description hereinafter can be considered to be with respect to one pixel of such an array. Fabrication of an AGP structure is readily achieved by conventional CVD technology as mentioned above with respect to the prior art. The device described hereinafter is for the case of n-doped germanium; however, one could employ p-type doping instead. Furthermore, other materials, e.g., Si or GaAs, could be chosen to provide alternative spectral response.

The base material or substrate 28 is degenerate n-type $(n^{++})$ germanium. CVD is employed to grow sequentially the alternating layers 30, 32 and finally 34 comprising, respectively, $n^-$, $n^+$, $n^-$, $n^+$, $n^-$, $n^+$, ... $n^-$, $n^+$, $n^-$, $n^{++}$. The last layer 34 $(n^{++})$ is transparent contact of thickness "d" (typically 1 μm). To the above structure as grown by CVD processes, a back metal contact 36 and a top metal contact 38 on the periphery of the pixel element are deposited by conventional means.

FIG. 4 is an expanded doping profile of the several alternating layers 28, 30, 32, 34 of FIG. 3 with the n−, n+ layers 30, 32 having thicknesses of "a" and "b", respectively. The total number of n+ layers 32 is "N"; so, the quantity Na is the total absorption thickness and ideally should be at least as large as the photon absorption length, i.e. greater than 100 μm. Individual layer thickness "a" must be small compared to a conduction-electron diffusion length, and is projected to have an optimum value in the range 0.1–1.0 μm. The dopant concentration n+ of the impurity-band layers 32 is in the low $10^{16}$ cm$^{-3}$ range. The concentration n− is significantly lower in order to provide the high resistivity layers (of thickness "b") to support the applied voltage V, and is likely to be less than $10^{15}$ cm$^{-3}$.

It is worthy of note at this point that, while not yet investigated in depth at this time, the voltage drop V/N in each n− layer can be used to control the desired level (or absence) of impact ionization. This potentially vital aspect will be developed as further work is undertaken; however, it is to be considered as part of the scope and spirit of the present invention as disclosed herein.

The principle of the detector of the present invention can best be understood with reference to FIGS. 5 and 8. The n+ layers 32 contain donor bands 33 which can release electrons 22 upon impingement by IR photons 20 of energy hν greater than the energy gap ε. The n− layers 30, on the other hand, cannot release electrons since they do not contain donor bands and are depleted of electrons due to the donor concentration n−. In the presence of a voltage "V" being connected across the structure 26 in the manner of FIG. 1, local fields are produced across the layers 30, 32 as depicted FIG. 8. Upon impingement by an IR photon of energy hν greater than ε, each of the n+ layers 32 has electrons 22 which can be excited into the conduction band where they drift to the adjacent n− layer 30.

The above-described structure of the present invention and its method of operation provide several beneficial effects. For one, because there are multiple layers 32 sufficient in total thickness to absorb virtually all of the impinging IR photons, the quantum efficiency can be high. This high quantum efficiency is achieved with only moderate requirements on doping control and background impurities. These relaxed material requirements over the prior BIB technology makes the AGP detector of the present invention much more suitable for array technology. These relaxed requirements also make it a more robust detector and less susceptable to radiation damage in space applications. It should be specifically noted that these advantages may also be achieved in Si and GaAs AGP architectures in other spectral regions. When employing Si in an AGP structure for LWIR detection, for example, the n+ layers would be doped in the $10^{17}$ cm$^{-3}$ range with the n− at $10^{15}$ cm$^{-3}$ maximum.

The AGP detector 26 of the present invention also has the potential for "gain" provided from two sources. For one, photo electrons 22 released from a particular layer 32 move through the remaining layers 32 of the detector 26. In the process, they may impact ionize other electrons 22 in their path causing an increase in the number of electrons 22 flowing as a result of the initiating impingement at the first layer 32, e.g. a gain in the signal produced by the structure. For another, as each electron 22 is released, a "hole" 24 is left behind. The electrical imbalance caused by the presence of the hole 24 causes electrons 22 from adjacent layers to be attracted during the life of the hole 24. This increase in the number of electrons 22 flowing is a gain in the signal produced and is given by the formula—GAIN =LIFE OF HOLE/TRANSIT TIME OF ELECTRON.

As an additional consideration, because of its multi-layered construction as opposed to the single active layer construction of BIB detectors as described above, the AGP detector of the present invention inherently provides certain desired attributes not possible with BIB detectors. Moreover, the construction invites customization to achieve specific characteristics which may be desirable in a particular application. For example, the energy gap ε and thus the spectral response of an AGP detector depends on the concentration of n+ and, in the structure according to the present invention, can be tailored to specific applications. n+ can be varied within each layer 32' as depicted in FIG. 9 as compared with FIG. 6, or can be varied from layer 32 to layer 32 as shown in the photodetector 26' of FIG. 11 to achieve, for example, flat, broad-band response.

It is also worthy of special note with respect to the structure of the present invention that if the dopant is homogeneous throughout the n+ layers 32 as depicted in FIG. 6, the donor band/conduction band interface will have a sharp break as depicted in FIG. 7. If, on the other hand, the dopant is graded in concentration from the center of the n+ layers 32 towards the edges as depicted in FIG. 9 the donor band/conduction band interface will taper-off as depicted in FIG. 10, thus increasing the breakdown level. The ability to manipulate the performance and characteristics of the detector of the present invention is a major point of novelty thereof over the prior art.

We claim:

1. An infrared photodetector comprising:
    (a) a substrate of a semiconductor material;
    (b) first contact means for applying an electrical potential to a back side of said substrate;
    (c) at least four high resistivity layers of said semiconductor material disposed on a top surface of said substrate, said layers of said first material being of substantially equal thickness and being doped a conductive type with a doping concentration therein sufficiently low as to not include conducting donor bands and being depleted of electrons;
    (d) at least three impurity-band layers of said semiconductor material disposed on said layers of said first material, said layers of said second material being of substantially equal thickness and being doped said conductivity type with a doping concentration therein sufficiently high to include donor bands which can release electrons upon impingement by infrared photons of energy hν greater than an energy gap ε;
    (e) means for applying an electrical field across said substrate and said plurality of layers;
    (f) a layer of a transparent contact material disposed on a top one of said layers of said first material; and
    (g) second contact means for applying an electrical potential to a top side of said layer of a transparent contact material.

2. The infrared photodetector of claim 1 wherein:
    (a) said substrate is degenerate germanium;

(b) said impurity-band layers are layers of germanium doped to approximately the low $10^{16}$ cm$^{-3}$ range; and, (c) said high resistivity layers are layers of germanium doped to a maximum of approximately $10^{15}$ cm$^{-3}$.

3. The infrared photodetector of claim 1 wherein:

(a) said substrate is silicon;

(b) said impurity-band layers are layers of silicon doped to approximately the $10^{17}$ cm$^{-3}$ range; and, (c) said high resistivity layers are layers of silicon doped to a maximum of approximately $10^{15}$ cm$^{-3}$.

4. The infrared photodetector of claim 2 wherein:

(a) said substrate is degenerate n-type (n++) germanium;

(b) said impurity-band layers are n+ layers of germanium; and, (c) said high resistivity layers are n− layers of germanium.

5. The infrared photodetectors of claim 1 wherein:
said impurity-band layers have a thickness less than a conduction-electron diffusion length in said semiconductor material.

6. The infrared photodetector of claim 5 wherein:
said impurity-band layers are in the range of 0.1–1.0 micron in thickness.

7. The infrared photodetector of claim 1 wherein:
the number of said impurity-band layers is such that a flux of infrared photons passing therethrough will be substantially totally absorbed by said impurity-band layers.

8. The infrared photodetector of claim 1 wherein:
the thickness of each of said high resistivity layers is such compared to a voltage applied to said first and second contact means that a voltage drop in each of said high resistivity layers controls the occurrence of impact ionization in said impurity-band layers to a desired level.

9. The infrared photodetector of claim 1 wherein:
the doping level in each of said impurity-band layers is different from the doping level in others of said impurity-band layers so as to achieve a desired spectral response across the entire photodetector.

10. The infrared photodetector of claim 1 wherein:
the doping level in each of said impurity-band layers is varied so as to be more concentrated in a center portion of each said layers so as to increase the breakdown level of the photodetector.

* * * * *